US012757462B2

(12) United States Patent
Hikosaka

(10) Patent No.: US 12,757,462 B2
(45) Date of Patent: Oct. 6, 2026

(54) NITRIDE SEMICONDUCTOR AND SEMICONDUCTOR DEVICE

(71) Applicants: KABUSHIKI KAISHA TOSHIBA, Tokyo (JP); TOSHIBA INFRASTRUCTURE SYSTEMS & SOLUTIONS CORPORATION, Kawasaki (JP)

(72) Inventor: Toshiki Hikosaka, Kawasaki Kanagawa (JP)

(73) Assignee: KABUSHIKI KAISHA TOSHIBA, Kawasaki (JP)

(*) Notice: Subject to any disclaimer, the term of this patent is extended or adjusted under 35 U.S.C. 154(b) by 458 days.

(21) Appl. No.: 18/361,668

(22) Filed: Jul. 28, 2023

(65) Prior Publication Data

US 2024/0154004 A1 May 9, 2024

(30) Foreign Application Priority Data

Nov. 8, 2022 (JP) ................................ 2022-178633

(51) Int. Cl.
*H10D 62/60* (2025.01)
*H10D 30/47* (2025.01)
(Continued)

(52) U.S. Cl.
CPC ........... *H10D 62/60* (2025.01); *H10D 30/475* (2025.01); *H10D 62/8503* (2025.01); *H10D 62/854* (2025.01)

(58) Field of Classification Search
CPC .. H10D 62/60; H10D 62/8503; H10D 62/854; H10D 30/475
See application file for complete search history.

(56) References Cited

U.S. PATENT DOCUMENTS

| | | | | |
|---|---|---|---|---|
| 9,231,064 B1 * | 1/2016 | Reza | .................. | H10D 30/4735 |
| 2007/0004184 A1 * | 1/2007 | Saxler | ................ | H10D 30/4755 257/85 |

(Continued)

FOREIGN PATENT DOCUMENTS

| | | | |
|---|---|---|---|
| JP | 2009-21362 | A | 1/2009 |
| JP | 2010-232297 | A | 10/2010 |

(Continued)

OTHER PUBLICATIONS

Japan Patent Office, Office Action in JP App. No. 2022-178633 (Oct. 1, 2025).

*Primary Examiner* — Marc-Anthony Armand
(74) *Attorney, Agent, or Firm* — Finnegan, Henderson, Farabow, Garrett & Dunner, LLP

(57) ABSTRACT

According to one embodiment, a nitride semiconductor includes a nitride member. The nitride member include a first nitride region, a second nitride region, and intermediate region. The first nitride region includes $Al_{x1}Ga_{1-x1}N$ ($0 \leq x1 < 1$). The $Al_{x1}Ga_{1-x1}N$ includes a first element including at least one selected from the group consisting of Fe and Mn. The second nitride region includes $Al_{x2}Ga_{1-x2}N$ ($0 \leq x2 \leq 1$). A direction from the first nitride region to the second nitride region is along a first direction. The intermediate region is provided between the first nitride region and the second nitride region. The intermediate region includes $Al_{z1}Ga_{1-z1}N$ ($0 \leq z1 \leq 1$, $x1 < z1$, $x2 < z1$). The $Al_{z1}Ga_{1-z1}N$ includes oxygen. A concentration of oxygen in the nitride member becomes maximum in the intermediate region.

20 Claims, 8 Drawing Sheets

(51) Int. Cl.
*H10D 62/85* (2025.01)
*H10D 62/854* (2025.01)

(56) References Cited

U.S. PATENT DOCUMENTS

| | | | |
|---|---|---|---|
| 2010/0244098 A1 | 9/2010 | Yokoyama et al. | |
| 2012/0025203 A1* | 2/2012 | Nakata ............... | H10D 62/8503 257/E29.089 |
| 2013/0175543 A1 | 7/2013 | Kiyama et al. | |
| 2017/0309712 A1* | 10/2017 | Yamada ................. | H10D 62/60 |
| 2020/0399184 A1 | 12/2020 | Tanaka et al. | |
| 2021/0226016 A1 | 7/2021 | Hikosaka et al. | |
| 2022/0028981 A1 | 1/2022 | Fujikura et al. | |
| 2024/0063270 A1* | 2/2024 | Liu ...................... | H10H 20/825 |

FOREIGN PATENT DOCUMENTS

| | | |
|---|---|---|
| JP | 2012-9630 A | 1/2012 |
| JP | 2012-199398 A | 10/2012 |
| JP | 2017-168862 A | 9/2017 |
| JP | 2021-2616 A | 1/2021 |
| JP | 2021-114548 A | 8/2021 |
| JP | 2022-15092 A | 1/2022 |

* cited by examiner

NITRIDE SEMICONDUCTOR AND SEMICONDUCTOR DEVICE

CROSS-REFERENCE TO RELATED APPLICATIONS

This application is based upon and claims the benefit of priority from Japanese Patent Application No. 2022-178633, filed on Nov. 8, 2022; the entire contents of which are incorporated herein by reference.

FIELD

Embodiments of the invention generally relate to a nitride semiconductor and a semiconductor device.

BACKGROUND

For example, in semiconductor devices based on nitride semiconductors, improved characteristics are desired.

DETAILED DESCRIPTION

Figure 1:
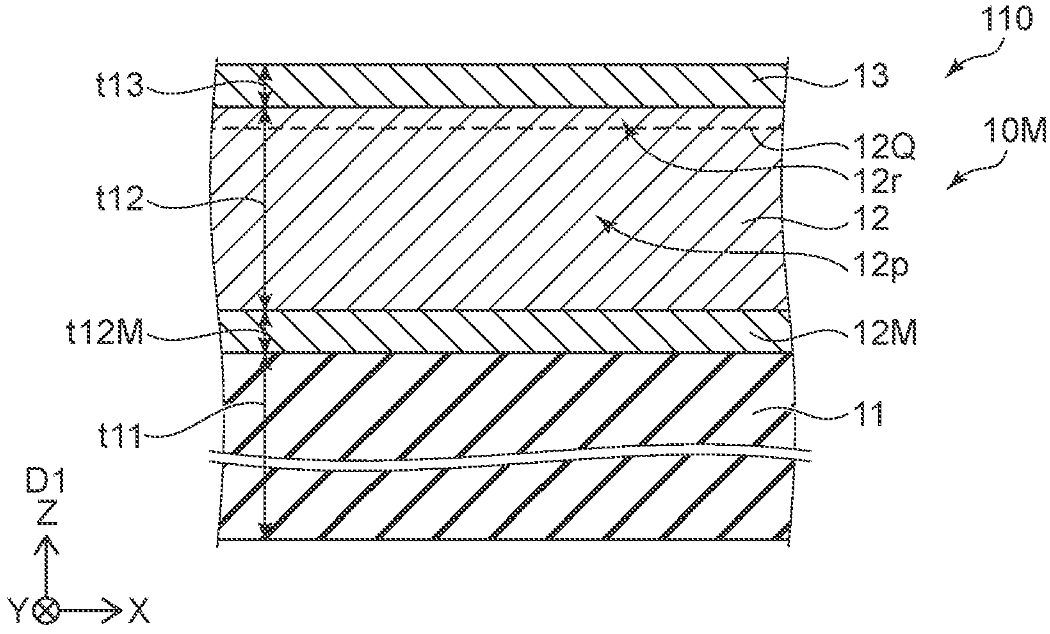
FIG. 1 is a schematic cross-sectional view illustrating a nitride semiconductor according to a first embodiment.

According to one embodiment, a nitride semiconductor includes a nitride member. The nitride member include a first nitride region, a second nitride region, and intermediate region. The first nitride region includes $Al_{x1}Ga_{1-x1}N$ ($0 \le x1 < 1$). The $Al_{x1}Ga_{1-x1}N$ includes a first element including at least one selected from the group consisting of Fe and Mn. The second nitride region includes $Al_{x2}Ga_{1-x2}N$ ($0 \le x2 < 1$). A direction from the first nitride region to the second nitride region is along a first direction. The intermediate region is provided between the first nitride region and the second nitride region. The intermediate region includes $Al_{z1}Ga_{1-z1}N$ ($0 \le z1 \le 1$, $x1 < z1$, $x2 < z1$). The $Al_{z1}Ga_{1-z1}N$ includes oxygen. A concentration of oxygen in the nitride member becomes maximum in the intermediate region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a nitride semiconductor according to a first embodiment.

As shown in FIG. 1, a nitride semiconductor 110 according to the embodiment includes a nitride member 10M.

The nitride member 10M includes a first nitride region 11, a second nitride region 12 and an intermediate region 12M. The nitride member 10M is, for example, a crystal. The first nitride region 11, the second nitride region 12 and the intermediate region 12M are crystals, for example.

The first nitride region 11 includes $Al_{x1}Ga_{1-x1}N$ ($0 \le x1 < 1$). The $Al_{x1}Ga_{1-x1}N$ ($0 \le x1 < 1$) includes a first element including at least one selected from the group consisting of Fe and Mn. In the $Al_{x1}Ga_{1-x1}N$, the composition ratio x1 is, for example, not less than 0 and not more than 0.1. The $Al_{x1}Ga_{1-x1}N$ can be, for example, GaN. The first nitride region 11 may be, for example, GaN including the first element. The first nitride region 11 is, for example, Fe-doped GaN or Mn-doped GaN.

The second nitride region 12 includes $Al_{x2}Ga_{1-x2}N$ ($0 \le x2 < 1$). In The $Al_{x2}Ga_{1-x2}N$, the composition ratio x2 is, for example, not less than 0 and not more than 0.1. the $Al_{x2}Ga_{1-x2}N$ can be, for example, GaN. A first concentration of the first element in the first nitride region 11 is higher than a second concentration of the first element in the second nitride region 12. Alternatively, the second nitride region 12 does not includes the first element. The second nitride region 12 is, for example, non-doped GaN.

A direction from the first nitride region 11 to the second nitride region 12 is along a first direction D1. The first direction D1 is defined as a Z-axis direction. One direction perpendicular to the Z-axis direction is defined as an X-axis direction. A direction perpendicular to the Z-axis direction and the X-axis direction is defined as a Y-axis direction. The first nitride region 11 and the second nitride region 12 extend substantially parallel to the X-Y plane.

The intermediate region 12M is provided between first nitride region 11 and second nitride region 12. The intermediate region 12M includes $Al_{z1}Ga_{1-z1}N$ ($0 < z1 \le 1$, $x1 < z1$, $x2 < z1$) including oxygen. In $Al_{z1}Ga_{1-z1}N$, the composition ratio z1 is 0.8 or more and 1 or less. The intermediate region 12M includes AlGaN or AlN, for example. A concentration of oxygen in the nitride member 10M becomes maximum in the intermediate region 12M. The intermediate region 12M may contact the second nitride region 12.

In the embodiment, by the first nitride region 11 including the first element, high electrical resistance is obtained in the first nitride region 11. The first nitride region 11 is, for example, an insulating or semi-insulating base body. By using such a first nitride region 11, a semiconductor device using nitride semiconductor 110 can operate stably. The intermediate region 12M may be in contact with first nitride region 11.

If the first nitride region 11 includes the first element, the first element may migrate (e.g., diffuse) into the second nitride region 12 or into the nitride region thereon. If the first element moves, it may become difficult to obtain desired characteristics in a semiconductor device using the nitride semiconductor 110. When the first element moves, for example, carrier mobility decreases. When the first element moves, for example, current collapse increases, making it difficult to obtain stable operation. The movement of the first element, for example, reduces reliability.

In the embodiment, as described above, the concentration of oxygen in the nitride member 10M is maximized in the intermediate region 12M. Such an intermediate region 12M provides a low concentration of the first element in the second nitride region 12 or the nitride region thereon even when the first nitride region 11 includes the first element. According to the embodiment, it is possible to provide a nitride semiconductor capable of improving characteristics. According to the embodiments, for example, a nitride semiconductor capable of achieving high carrier mobility can be provided.

It is considered that the intermediate region 12M including oxygen suppresses the migration of the first element from first nitride region 11 to second nitride region 12. For example, oxygen (or a structure based on oxygen) is considered to act as a trap to capture the first element.

In the embodiment, for example, the oxygen concentration in the intermediate region 12M is higher than the oxygen concentration in the first nitride region 11 and higher than the oxygen concentration in the second nitride region 12. Alternatively, the first nitride region 11 and the second nitride region 12 do not include oxygen.

For example, if the first nitride region 11 includes oxygen at a high concentration, it becomes difficult to obtain high crystallinity in the first nitride region 11. For example, if the second nitride region 12 includes oxygen at a high concentration, it becomes difficult to obtain high crystallinity in the second nitride region 12. For example, it is difficult to obtain desired characteristics in a semiconductor device using the nitride semiconductor 110. For example, current leakage tends to increase.

As shown in FIG. 1, in this example, the nitride member 10M further includes a third nitride region 13. The third nitride region 13 includes $Al_{x3}Ga_{1-x3}N$ (0<x3≤1, x2<x3). In the $Al_{x3}Ga_{1-x3}N$, for example, the composition ratio x3 is not less than 0.05 and more than 1. The composition ratio x3 may be not less than 0.15 and not more than 0.3. The third nitride region 13 is, for example, AlGaN.

The second nitride region 12 is located between the first nitride region 11 and the third nitride region 13. The second nitride region 12 may contact the third nitride region 13. As shown in FIG. 1, the second nitride region 12 includes a region facing the third nitride region 13. A carrier region 12Q may be formed in this region. The carrier region 12Q is, for example, a two-dimensional electron gas. In the operation of a semiconductor device using nitride semiconductor 110, the carrier region 12Q is used.

Figure 2A:
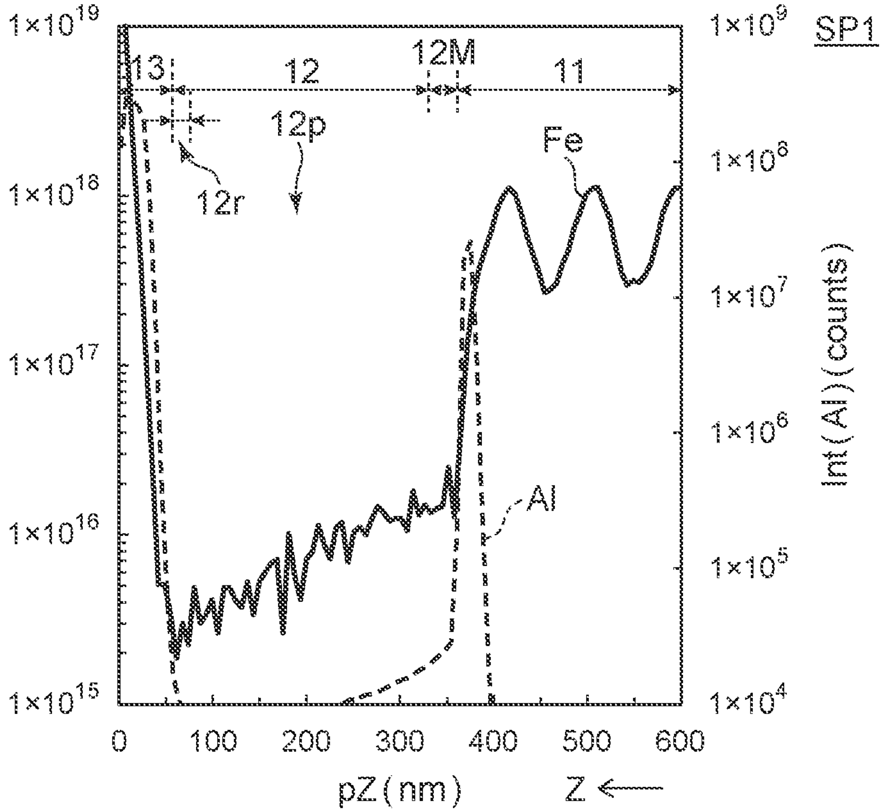
FIGS. 2A and 2B are graphs illustrating the nitride semiconductors according to the first embodiment.
Figure 2B:
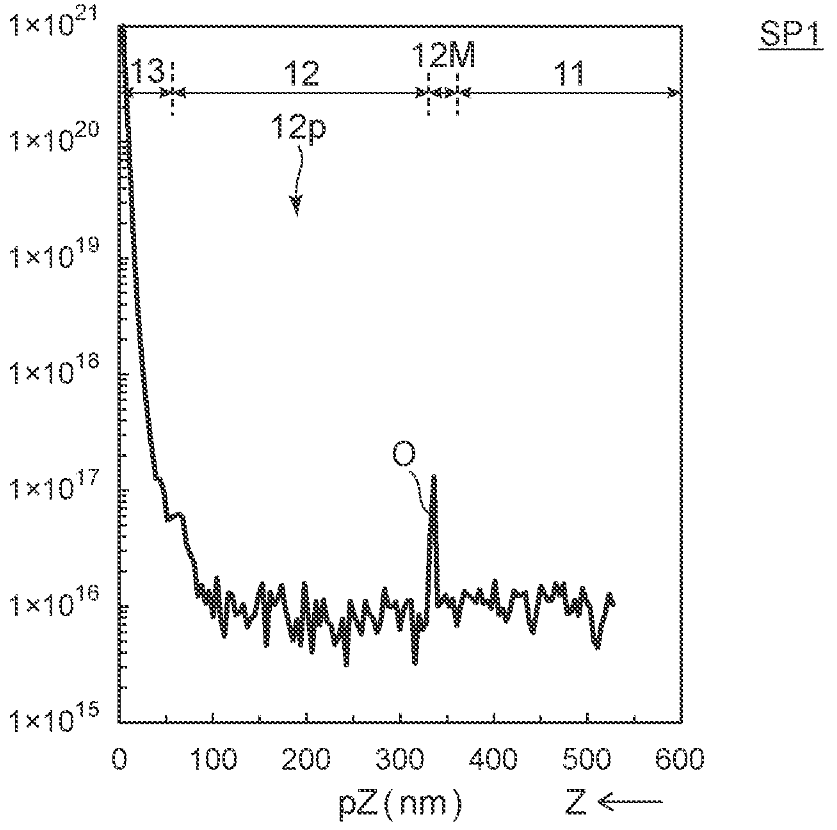

FIGS. 2A and 2B are graphs illustrating the nitride semiconductors according to the first embodiment.

These figures are examples of SIMS (Secondary Ion Mass Spectrometry) analysis results of a first sample SP1. The first sample SP1 is obtained by forming the intermediate region 12M on the first nitride region 11, forming the second nitride region 12 on the intermediate region 12M, and forming the third nitride region on the second nitride region 12. These regions are formed by epitaxial growth. The intermediate region 12M including oxygen is formed by using a raw material gas including oxygen when forming the intermediate region 12M. In this example, a source gas including oxygen and hydrocarbons is used.

In FIGS. 2A and 2B, the profile of the elements in the nitride member 10M in the Z-axis direction is shown. In this example, the first element is Fe. The horizontal axis of these figures is the position pZ in the Z-axis direction. The left vertical axis in FIG. 2A is the concentration (C(Fe)) of Fe. The right vertical axis of FIG. 2A is the detected intensity Int (Al) of Al. The vertical axis in FIG. 2B is the concentration (C(O)) of oxygen. In these figures, the first nitride region 11, the intermediate region 12M, the second nitride region 12, and the third nitride region 13 are shown.

As shown in FIG. 2A, the concentration of Al is high in the intermediate region 12M and the third nitride region 13. A high concentration of Fe is included in the first nitride region 11. The concentration of Fe drops sharply in the intermediate region of 12M. In the intermediate region 12M, the migration (e.g., diffusion) of Fe from the first nitride region 11 to the second nitride region 12 is suppressed. It is considered that the high concentration of Fe is detected in the third nitride region 13 due to a surface adsorbate in the nitride member 10M.

As shown in FIG. 2B, the concentration of oxygen reaches a maximum in the intermediate region 12M. For example, the concentration of oxygen in the intermediate region 12M is higher than the concentration of oxygen in the first nitride region 11. For example, the concentration of oxygen in the intermediate region 12M is higher than the concentration of oxygen in the second nitride region 12. For example, the concentration of oxygen in the intermediate region 12M is higher than the concentration of oxygen at the middle position 12*p* (see FIG. 2B and FIG. 1) of the second nitride region 12 in the first direction D1. In the second nitride region 12, the high concentration of oxygen in the region near the third nitride region 13 is considered to be due to the surface adsorbate in the nitride member 10M.

As shown in FIG. 2B, the concentration of oxygen in the intermediate region 12M is, for example, $5\times10^{16}$ $cm^{-3}$ or more. The concentration of oxygen in the first nitride region 11 is, for example, less than $5\times10^{16}$ $cm^{-3}$. The concentration of oxygen at the middle position 12*p* of the second nitride region 12 is, for example, less than $5\times10^{16}$ $cm^{-3}$.

The concentration of oxygen in the intermediate region 12M is, for example, $5\times10^{18}$ $cm^{-3}$ or less. The concentration of oxygen in the intermediate region 12M may be $5\times10^{17}$ $cm^{-3}$ or less. For example, if the intermediate region 12M includes oxygen at an excessively high concentration, high crystallinity is difficult to be obtained in the second nitride region 12. For example, in a semiconductor device using a nitride semiconductor 110, current leakage tends to increase.

As shown in FIG. 2A, the concentration (first concentration) of the first element (Fe) in the first nitride region 11 is higher than the concentration (second concentration) of the first element in the second nitride region 12. Alternatively, the second nitride region 12 does not include the first element.

The first concentration is, for example, $1\times10^{17}$ $cm^{-3}$ or more. Thereby, sufficient insulation can be obtained in the first nitride region 11. The second concentration is, for example, less than $1\times10^{17}$ $cm^{-3}$. The second concentration may be, for example, $5\times10^{15}$ $cm^{-3}$ or less. The second concentration is, for example, 1/10 or less of the first concentration. The concentration of the first element (for example, Fe) at the middle position 12*p* is 1/10 or less of the first concentration. The second concentration may be, for example, 1/100 or less of the first concentration. The concentration of the first element (for example, Fe) at the middle position 12*p* may be 1/100 or less of the first concentration.

Figure 3A:
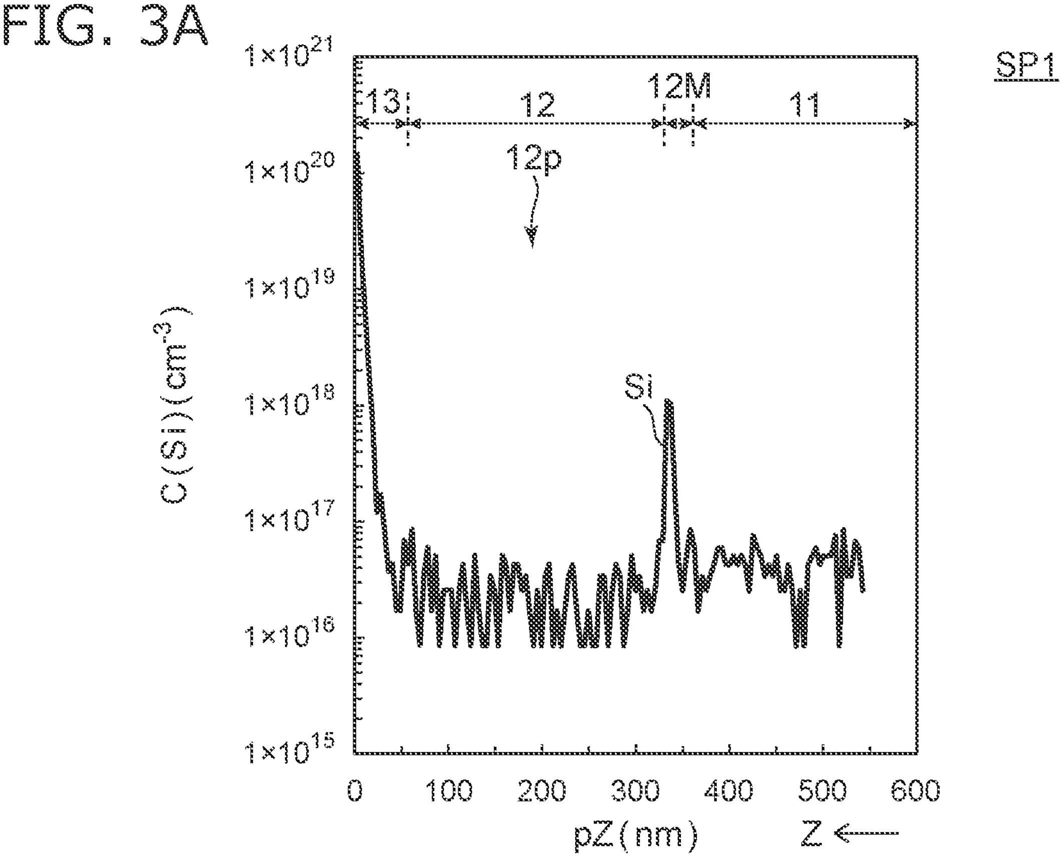
FIGS. 3A and 3B are graphs illustrating the nitride semiconductor according to the first embodiment.
Figure 3B:
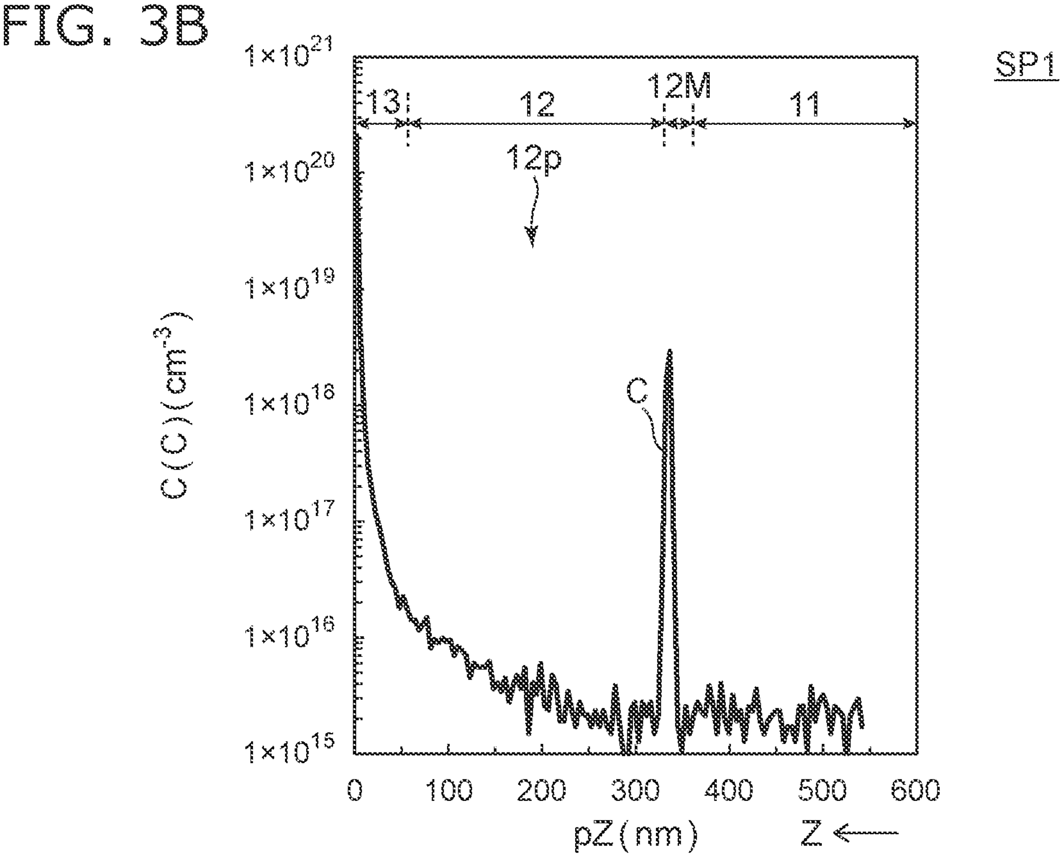

FIGS. 3A and 3B are graphs illustrating the nitride semiconductor according to the first embodiment.

These figures are examples of SIMS analysis results of the first sample SP1. The horizontal axis of these figures is the position pZ in the Z-axis direction. The vertical axis in FIG. 3A is the concentration (C(Si)) of silicon. The vertical axis in FIG. 3B is the concentration (C(C)) of carbon.

As shown in FIG. 3A, the concentration of silicon in the intermediate region 12M may be higher than the concentration of silicon in the first nitride region 11. The concentration of silicon in the intermediate region 12M may be higher than the concentration in the second nitride region 12. For example, the concentration of silicon in the intermediate region 12M may be higher than the concentration of silicon at the middle position 12*p*. Alternatively, the first nitride region 11 and the second nitride region 12 do not include silicon.

For example, the intermediate region 12M locally includes silicon. In the intermediate region 12M, movement (for example, diffusion) of the first element is suppressed. For example, a structure including silicon functions as a trap.

For example, the concentration of silicon in the intermediate region 12M is not less than $1\times10^{17}$ $cm^{-3}$ and 5x18 $cm^{-3}$. For example, when the concentration of silicon is lower than $1\times10^{17}$ $cm^{-3}$, the crystallinity of the second nitride region 12 tends to decrease. For example, if the silicon concentration is higher than $5\times10^{18}$ $cm^{-3}$, current leakage is likely to occur in the intermediate region 12M.

As shown in FIG. 3A, the carbon concentration in the intermediate region 12M may be higher than the carbon concentration in the first nitride region 11. The carbon concentration in the intermediate region 12M may be higher than the carbon concentration in the second nitride region 12. The concentration of carbon in the intermediate region 12M may be higher than the concentration of carbon at the middle position 12*p*. Alternatively, the first nitride region 11 and the second nitride region 12 do not include carbon.

For example, the intermediate region 12M locally includes carbon. In the intermediate region 12M, the movement (for example, diffusion) of the first element is suppressed. For example, carbon acts as a trap.

The concentration of carbon in the intermediate region 12M is, for example, not less than $1\times10^{17}$ $cm^{-3}$ and not more than $5\times10^{18}$ $cm^{-3}$. For example, if the carbon concentration is lower than $1\times10^{17}$ $cm^{-3}$, current leakage is likely to occur in the intermediate region 12M. For example, if the carbon concentration is higher than $5\times10^{18}$ $cm^{-3}$, the crystallinity of the second nitride region 12 tends to deteriorate.

As shown in FIGS. 1 and 2A, the second nitride region 12 includes a contact region 12*r* contacting the third nitride region 13. The thickness of the contact region 12*r* in the first direction D1 is 1/10 of the thickness of the second nitride region 12 in the first direction D1. The concentration of the first element (for example, Fe) in the contact region 12*r* is 1/20 or less of the concentration of the first element in the first nitride region 11.

Figure 4A:
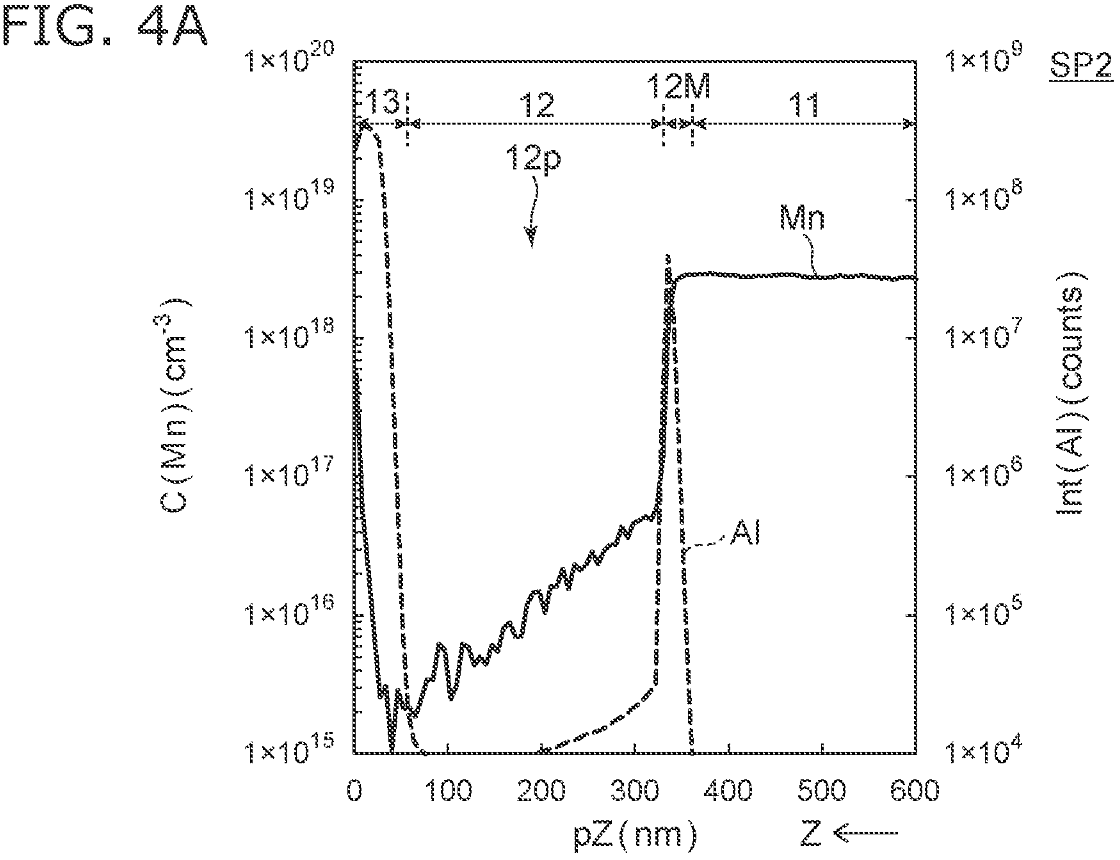
FIGS. 4A and 4B are graphs illustrating the nitride semiconductor according to the first embodiment.
Figure 4B:
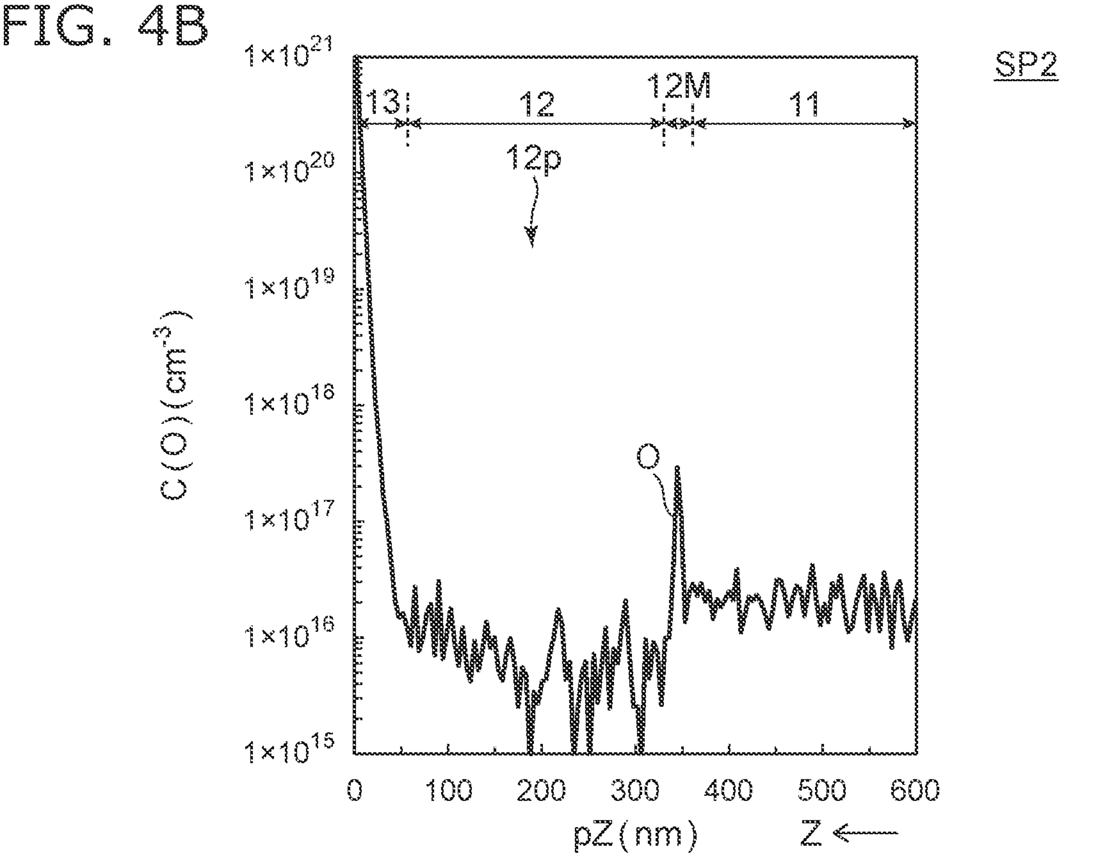

FIGS. 4A and 4B are graphs illustrating the nitride semiconductor according to the first embodiment.

These figures show examples of SIMS analysis results of a second sample SP2. In the second sample SP2, the first element is Mn. Except for this, the configuration of the second sample SP2 is the same as the configuration of the first sample SP1.

The horizontal axis of FIGS. 4A and 4B is the position pZ in the Z-axis direction. The left vertical axis in FIG. 4A is the concentration (C(Mn)) of Mn. The right vertical axis of FIG. 4A is the detected intensity Int (Al) of Al. The vertical axis in FIG. 4B is the concentration (C(O)) of oxygen.

As shown in FIG. 4A, the concentration of Al is high in the intermediate region 12M and the third nitride region 13. Mn is included at a high concentration in the first nitride region 11. The concentration of Mn decreases rapidly in the intermediate region 12M. In the intermediate region 12M, the movement (e.g., diffusion) of Mn from the first nitride region 11 to the second nitride region 12 is suppressed.

As shown in FIG. 4A, the concentration (first concentration) of Mn (first element) in the first nitride region 11 is higher than the concentration (second concentration) of Mn (first element) in the second nitride region 12. The second nitride region 12 need not include the first element.

As shown in FIG. 4B, the concentration of oxygen reaches a maximum in the intermediate region 12M. For example, the concentration of oxygen in the intermediate region 12M is higher than the concentration of oxygen in the first nitride region 11. For example, the concentration of oxygen in the intermediate region 12M is higher than the concentration of oxygen in the second nitride region 12. For example, the concentration of oxygen in the intermediate region 12M is higher than the concentration of oxygen at the middle position 12*p* (see FIG. 4B) of the second nitride region 12 in the first direction D1.

As shown in FIG. 4B, the concentration of oxygen in the intermediate region 12M is, for example, not less than $5\times10^{16}$ $cm^{-3}$. The concentration of oxygen in the first nitride region 11 is, for example, less than $5\times10^{16}$ $cm^{-3}$. The concentration of oxygen at the middle position 12*p* of the second nitride region 12 is, for example, less than $5\times10^{16}$ $cm^{-3}$.

The concentration of oxygen in the intermediate region 12M is, for example, $5\times10^{18}$ $cm^{-3}$ or less. The concentration of oxygen in the intermediate region 12M may be $5\times10^{17}$ $cm^{-3}$ or less. For example, if the intermediate region 12M includes oxygen at an excessively high concentration, high crystallinity is difficult to be obtained in the second nitride region 12. For example, in a semiconductor device using a nitride semiconductor 110, current leakage tends to increase.

In the second sample SP2, the first concentration is, for example, $1\times10^{17}$ $cm^{-3}$ or more. The second concentration is, for example, less than $1\times10^{17}$ $cm^{-3}$. The second concentration may be, for example, $5\times10^{15}$ $cm^{-3}$ or less.

Even when the first element is Mn, the migration (e.g., diffusion) of the first element to the second nitride region 12 can be suppressed by providing the intermediate region 12M locally including oxygen.

For silicon and carbon, a profile similar to that of the first sample SP1 can be obtained in the second sample SP2.

Figure 5:
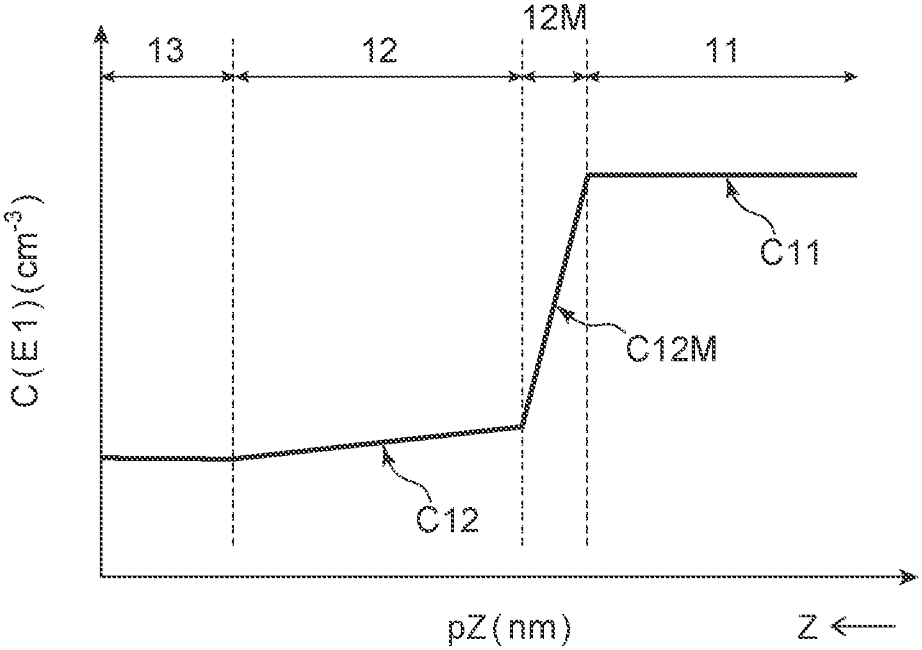
FIG. 5 is a graph illustrating a nitride semiconductor according to the first embodiment.

FIG. 5 is a graph illustrating a nitride semiconductor according to the first embodiment.

The horizontal axis of FIG. 5 is the position pZ in the Z-axis direction. The vertical axis is the logarithm of the concentration of the first element (C (E1)).

As shown in FIG. 5, the intermediate concentration C12M of the first element in the intermediate region 12M decreases along the first orientation from the first nitride region 11 to the second nitride region 12. The second concentration C12 of the first element in the second nitride region 12 decreases along the first orientation from the first nitride region 11 to the second nitride region 12. The first concentration C11 of the first element in the first nitride region 11 may be decreased along the first orientation from the first nitride region 11 to the second nitride region 12.

The change rate of the intermediate concentration C12M with respect to the change of the position pZ along the first orientation is higher than the change rate of the first concentration C11 with respect to the change of the position pZ. For example, the change rate of the logarithm of the intermediate concentration C12M to the change of the position pZ along the first orientation is higher than the change rate of the logarithm of the first concentration C11 to the change of the position pZ. As described above, the first concentration C11 is the concentration of the first element in the first nitride region 11.

The change rate of the intermediate concentration C12M with respect to the change of the position pZ along the first orientation is higher than the change rate of the second concentration C12 with respect to the change of the position pZ. For example, the change rate of the logarithm of the intermediate concentration C12M to the change of the position pZ along the first orientation is higher than the change rate of the logarithm of the second concentration C12 to the change of the position pZ. As described above, the second concentration C12 is the concentration of the first element in the second nitride region 12.

The change rate of the second concentration C12 with respect to the change of the position pZ along the first orientation is higher than the change rate of the first concentration C11 with respect to the change of the position pZ. For example, the change rate of the logarithm of the second concentration C12 to the change of the position pZ along the first orientation is higher than the change rate of the logarithm of the first concentration C11 to the change of the position pZ.

In the intermediate region 12M, the concentration of the first element rapidly decreases. In the second nitride region 12, a low concentration of the first element is obtained.

As shown in FIG. 1, an intermediate region thickness t12M of the intermediate region 12M along the first direction D1 is, for example, not less than 0.5 nm and not more than 4 nm. If the intermediate region thickness t12M is less than 0.5 nm, for example, current leakage is likely to occur in the intermediate region 12M. When the intermediate region thickness t12M is thicker than 4 nm, the crystal quality of the second nitride region 12 tends to deteriorate.

A second nitride region thickness t12 of the second nitride region 12 along the first direction D1 is, for example, not less than 10 nm and not more than 1000 nm. When the second nitride region thickness t12 is less than 10 nm, the crystal quality tends to deteriorate in the second nitride region 12 or the nitride region thereon. When the second nitride region thickness t12 is thicker than 1000 nm, the electrical resistance of the second nitride region 12 becomes low. Current leakage is likely to occur.

A first nitride region thickness t11 of the first nitride region 11 along the first direction D1 is, for example, not less than 10 μm and not more than 1000 μm. For example, the first nitride region 11 is a substrate including $Al_{x1}Ga_{1-x1}N$ ($0 \leq x1 < 1$). For example, the $Al_{x1}Ga_{1-x1}N$ includes at least one selected from the group consisting of Fe and Mn. When the first nitride region thickness t11 is 10 μm or more, current leakage is easily suppressed. A semiconductor device using the nitride semiconductor 110 can operate stably. When the first nitride region thickness t11 is thicker than 1000 μm, malfunction due to defects is likely to occur.

A third nitride region thickness t13 of the third nitride region 13 along the first direction D1 is, for example, not less than 10 nm and not more than 50 nm. If the third nitride region thickness t13 is less than 10 nm, the carrier region 12Q is difficult to form. Mobility tends to decrease. If the third nitride region thickness t13 is thicker than 50 nm, defects tend to increase in the third nitride region 13. Mobility tends to decrease.

Figure 6A:
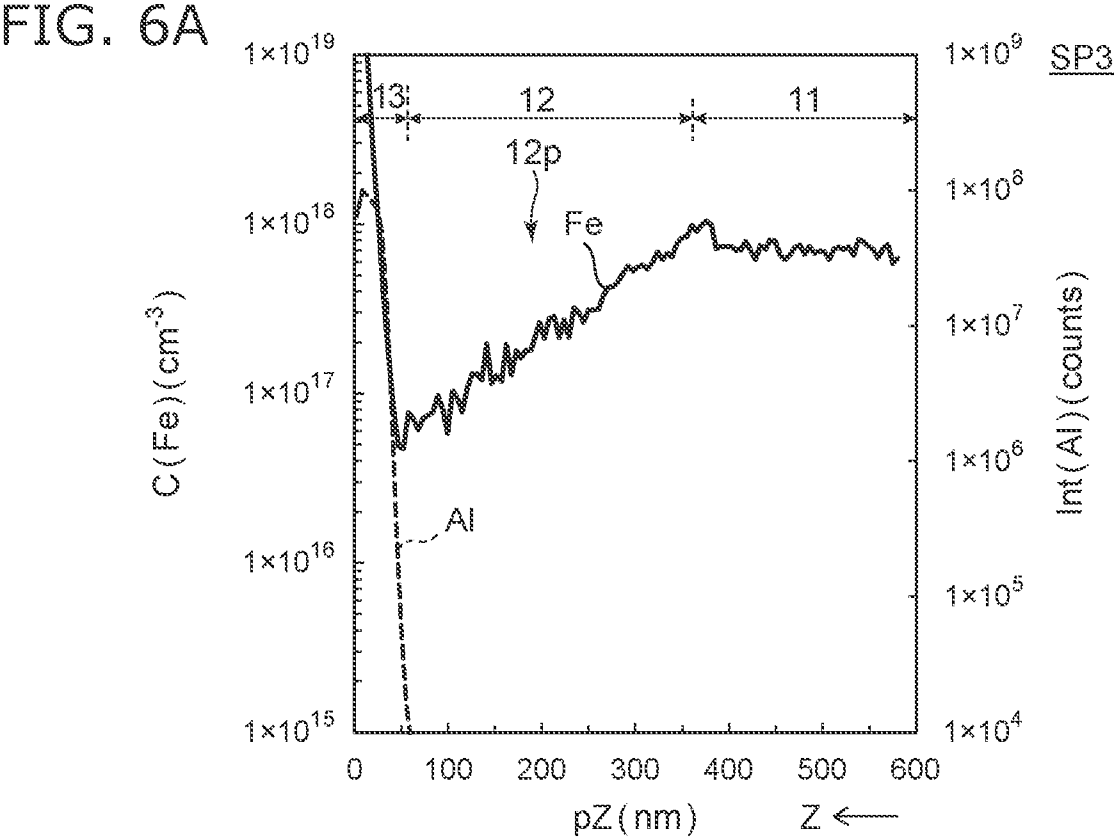
FIGS. 6A and 6B are graphs illustrating nitride semiconductors.
Figure 6B:
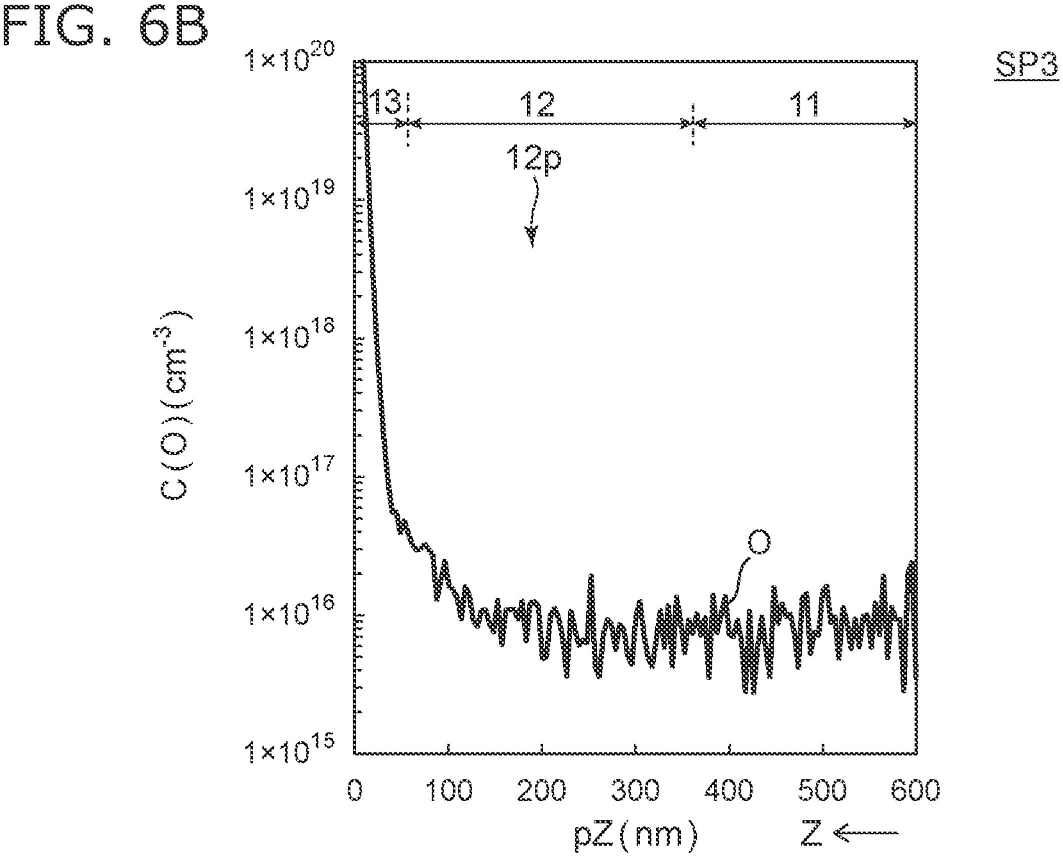

FIGS. 6A and 6B are graphs illustrating nitride semiconductors.

These figures are examples of the SIMS analysis results of a third sample SP3. The intermediate region 12M is not provided in the third sample SP3. The first element is Fe. Except for this, the configuration of the third sample SP3 is the same as the configuration of the first sample SP1. The third sample SP3 corresponds to a reference example.

As shown in FIG. 6A, in the third sample SP3, the concentration of Fe in the second nitride region 12 is higher than the concentration of Fe in the second nitride region 12 in the first sample SP1. The concentration of Fe in the second nitride region 12 is $1\times10^{17}$ $cm^{-3}$ or more. It is difficult to obtain the desired characteristics in the semiconductor device based on the third sample SP3.

As shown in FIG. 6B, the concentration of oxygen is less than $5\times10^{16}$ $cm^{-3}$ in the third sample SP3. In the third sample SP3, the concentration of oxygen does not reach the maximum in the nitride member 10M. The concentration of oxygen in the first nitride region 11 is, for example, less than $5\times10^{16}$ $cm^{-3}$. The concentration of oxygen at the middle position 12*p* of the second nitride region 12 is, for example, less than $5\times10^{16}$ $cm^{-3}$.

The carrier mobility characteristics are different among the first sample SP1, the second sample SP2, and the third sample SP3. The carrier mobilities of the first sample SP1, the second sample SP2, and the third sample SP3 are evaluated by Hall effect measurement. A high carrier mobility of 1850 cm 2/Vs is obtained in the first sample SP1. A high carrier mobility of 1830 $cm^2$/Vs is obtained in the second sample SP2. In the third sample SP3, the carrier mobility is as low as 1600 $cm^2$/Vs. Thus, in the second nitride region 12, high carrier mobility can be obtained due to the low concentration of the first element.

Figure 7:
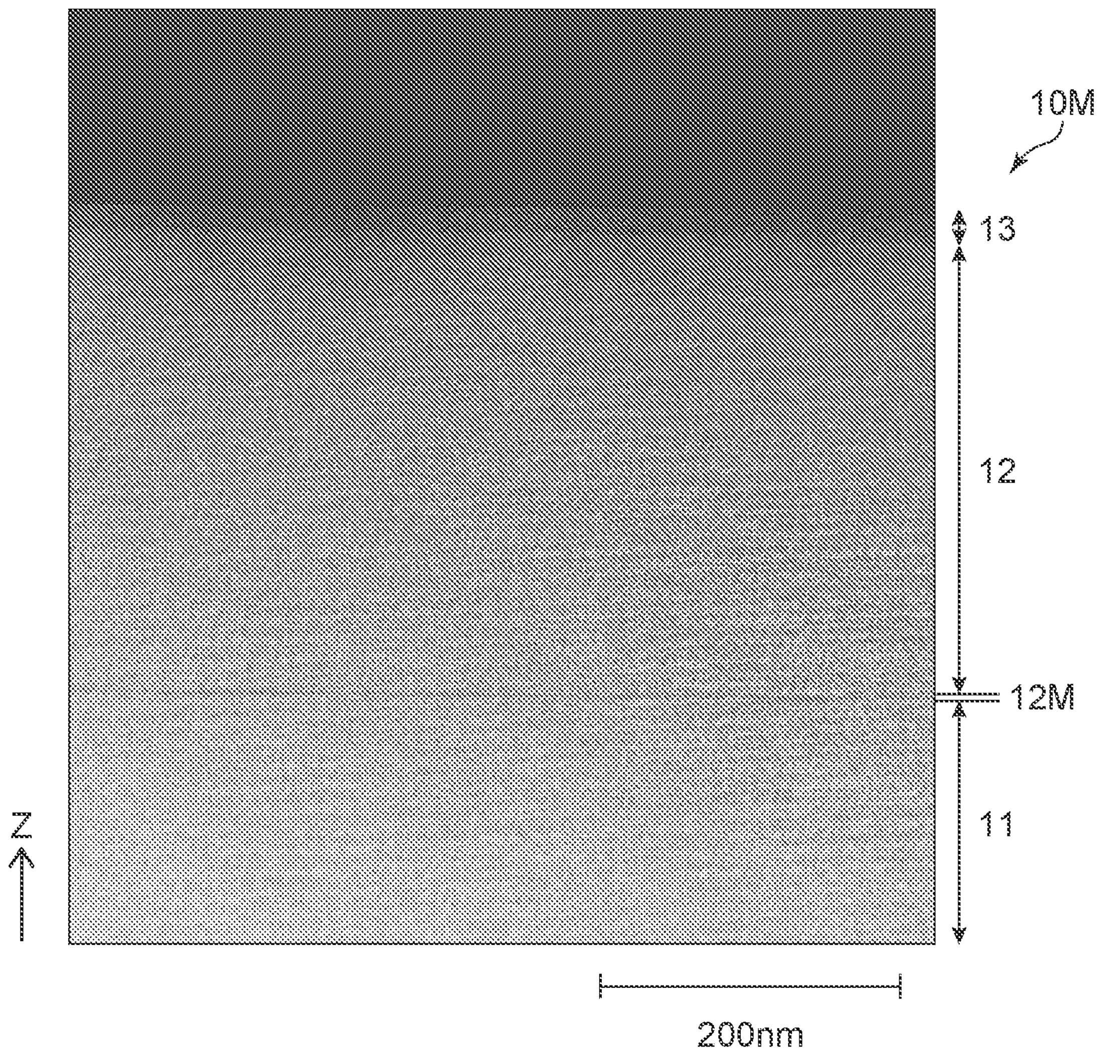
FIG. 7 is an electron micrograph showing an example of the nitride semiconductor according to the first embodiment.

FIG. 7 is an electron micrograph showing an example of the nitride semiconductor according to the first embodiment.

FIG. 7 is a TEM (Transmission Electron Microscopy) image of the first sample SP1. As shown in FIG. 7, the crystal lattice (intermediate crystal lattice) of the intermediate region 12M is continuous with the crystal lattice (first crystal lattice) of the first nitride region 11. The crystal lattice (second crystal lattice) of the second nitride region 12 is continuous with the intermediate crystal lattice. Good crystal quality is obtained. For example, in a direction perpendicular to the Z-axis direction (For example, in the direction of the X axis), the lattice length of the first nitride region 11 is substantially the same as the lattice length of the intermediate region 12M. The first nitride region 11 and the intermediate region 12M are lattice-matched. For example, in a direction perpendicular to the Z-axis direction (For example, in the direction of the X axis), the lattice length of the second nitride region 12 is substantially the same as the lattice length of the intermediate region 12M. The second nitride region 12 and the intermediate region 12M are lattice-matched.

In the embodiment, when the intermediate region 12M is formed at a high temperature (for example, 1100° C. or higher), the crystal lattice (intermediate crystal lattice) of the intermediate region 12M tends to be continuous with the crystal lattice (first crystal lattice) of the first nitride region 11. The crystal lattice (second crystal lattice) of the second nitride region 12 tends to be continuous with the intermediate crystal lattice. Good crystal quality is obtained. A source gas including oxygen may be used in the formation of the intermediate region 12M. For example, by using acetylene gas including oxygen, oxygen included in the raw material gas is easily taken into the intermediate region 12M.

Second Embodiment

The second embodiment relates to a semiconductor device.

Figure 8:
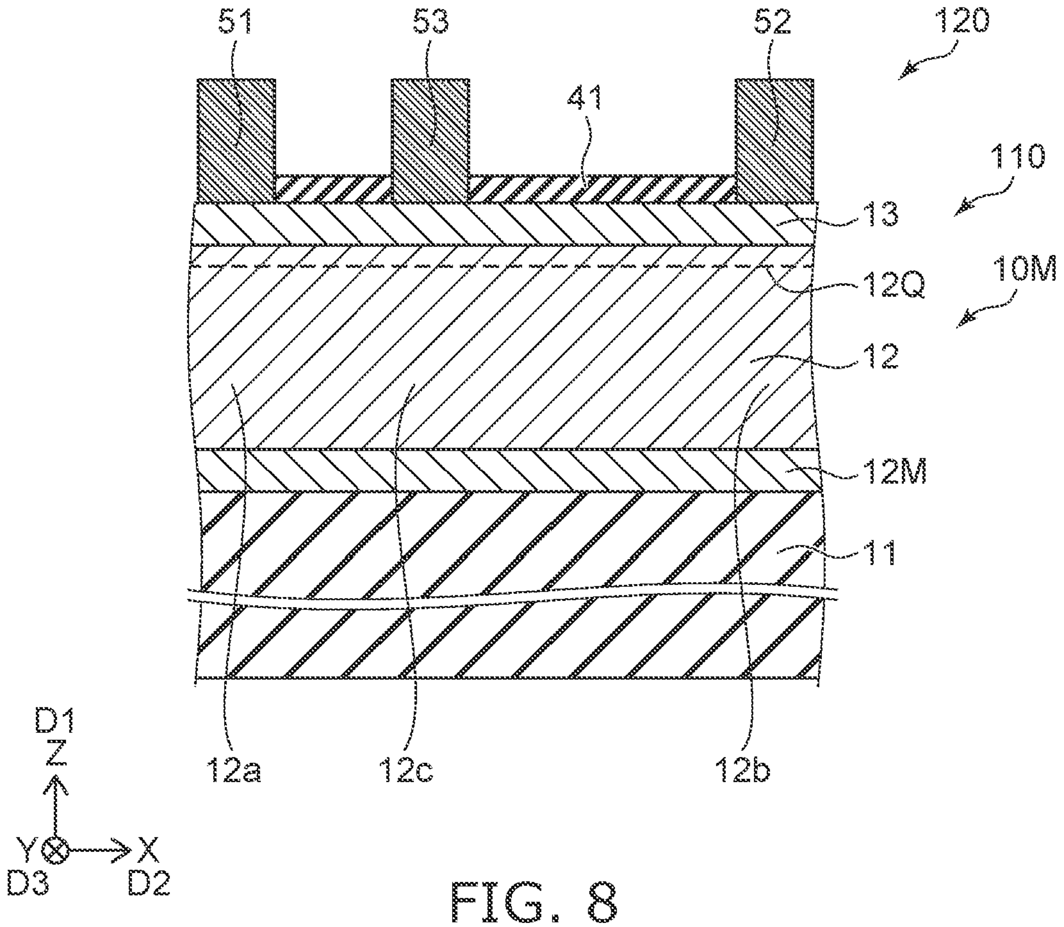
FIG. 8 is a schematic cross-sectional view illustrating a semiconductor device according to a second embodiment.

FIG. 8 is a schematic cross-sectional view illustrating a semiconductor device according to the second embodiment.

As shown in FIG. 8, a semiconductor device 120 according to the embodiment includes the nitride semiconductor 110 according to the first embodiment, a first electrode 51, a second electrode 52, and a third electrode 53.

A direction from the first electrode 51 to the second electrode 52 is along a second direction D2. The second direction D2 crosses the first direction D1.

A position of the third electrode 53 in the second direction D2 is between a position of the first electrode 51 in the second direction D2 and a position of the second electrode 52 in the second direction D2. The second nitride region 12 includes a first partial region 12*a*, a second partial region 12*b*, and a third partial region 12*c*. A direction from the first partial region 12*a* to the first electrode 51 is along the first direction D1. A direction from the second partial region 12*b* to the second electrode 52 is along the first direction D1. The third partial region 12*c* is located between the first partial region 12*a* and the second partial region 12*b* in the second direction D2. A direction from the third partial region 12*c* to the third electrode 53 is along the first direction D1.

The first electrode 51 is electrically connected to a portion of the third nitride region 13. The second electrode 52 is electrically connected to another portion of the third nitride region 13. The first electrode 51, the second electrode 52, and the third electrode 53 may extend along a third direction D3, for example. The third direction D3 crosses a plane including the first direction D1 and the second direction D2. The third direction D3 is, for example, the Y-axis direction.

In the semiconductor device 120, current flowing between the first electrode 51 and the second electrode 52 can be controlled by a potential of the third electrode 53. The potential of the third electrode 53 is, for example, a potential based on a potential of the first electrode 51. The first electrode 51 functions, for example, as a source electrode. The second electrode 52 functions, for example, as a drain electrode. The third electrode 53 functions, for example, as a gate electrode. The semiconductor device 120 is, for example, a HEMT (High Electron Mobility Transistor). The semiconductor device 120 is, for example, a high frequency transistor.

As shown in FIG. 8, a first insulating member 41 may be provided. The third nitride region 13 is provided between the second nitride region 12 and the first insulating member 41.

In this example, the third electrode 53 contacts the third nitride region 13. High-speed switching characteristics can be obtained. A first insulating member 41 may be provided between the third electrode 53 and the third nitride region 13.

According to embodiments, a low concentration of the first element is obtained in the second nitride region 12. For example, high carrier mobility can be obtained. According to the embodiment, defects can be suppressed. For example, defects caused by the first element can be suppressed. For example, pits can be suppressed. Thereby, for example, current leakage can be suppressed. According to the embodiments, it is possible to provide a semiconductor device whose characteristics can be improved.

The semiconductor device 120 can obtain, for example, high carrier mobility. For example, current collapse can be suppressed. High reliability is obtained.

In the embodiment, information about the shape of the nitride region and the like can be obtained by, for example, electron microscopic observation. Information about the composition and element concentration in the nitride region can be obtained, for example, by EDX (Energy Dispersive X-ray Spectroscopy) or SIMS. Information about the composition in nitride regions may be obtained, for example, by X-ray reciprocal space mapping or photoluminescence.

Embodiments may include the following configurations (for example, technical proposals).

Configuration 1

A nitride semiconductor, comprising:

a nitride member, the nitride member including:

a first nitride region including $Al_{x1}Ga_{1-x1}N$ ($0 \le x1 < 1$), the $Al_{x1}Ga_{1-x1}N$ including a first element including at least one selected from the group consisting of Fe and Mn;

a second nitride region including $Al_{x2}Ga_{1-x2}N$ ($0 \le x2 < 1$), a direction from the first nitride region to the second nitride region being along a first direction; and an intermediate region provided between the first nitride region and the second nitride region, the intermediate region including $Al_{z1}Ga_{1-z1}N$ ($0 \le z1 \le 1$, $x1 < z1$, $x2 < z1$), the $Al_{z1}Ga_{1-z1}N$ including oxygen, a concentration of oxygen in the nitride member becoming maximum in the intermediate region.

Configuration 2

The nitride semiconductor according to Configuration 1, wherein a concentration of oxygen in the intermediate region is higher than a concentration of oxygen in the first nitride region, or the first nitride region does not include oxygen, and the concentration of oxygen in the intermediate region is higher than a concentration of oxygen at a middle position of the second nitride region in the first direction.

Configuration 3

The nitride semiconductor according to Configuration 2, wherein the concentration of oxygen in the intermediate region is $5\times10^{16}$ $cm^{-3}$ or more, the concentration of oxygen in the first nitride region is less than $5\times10^{16}$ $cm^{-3}$, and the concentration of oxygen at the middle position is less than $5\times10^{16}$ $cm^{-3}$.

Configuration 4

The nitride semiconductor according to any one of Configurations 1-3, wherein a first concentration of the first element in the first nitride region is higher than a second concentration of the first element in the second nitride region, or the second nitride region does not include the first element.

Configuration 5

The nitride semiconductor according to Configuration 4, wherein the first concentration is $1\times10^{17}$ $cm^{-3}$ or more.

Configuration 6

The nitride semiconductor according to Configuration 4 or 5, wherein an intermediate concentration of the first element in the intermediate region decreases along a first orientation from the first nitride region to the second nitride region, and a change rate of the intermediate concentration with respect to a change of a position along the first orientation is higher than a change rate of the second concentration with respect to the change of the position.

Configuration 7

The nitride semiconductor according to Configuration 6, wherein the change rate of the intermediate concentration is higher than a change rate of the first concentration with respect to the change of the position.

Configuration 8

The nitride semiconductor according to any one of Configurations 1-7, wherein an intermediate region thickness of the intermediate region along the first direction is not less than 0.5 nm and not more than 4 nm.

Configuration 9

The nitride semiconductor according to Configuration 8, wherein a second nitride region thickness of the second nitride region along the first direction is not less than 10 nm and not more than 1000 nm.

Configuration 10

The nitride semiconductor according to Configuration 9, wherein a first nitride region thickness of the first nitride region along the first direction is not less than 10 μm and not more than 1000 μm.

Configuration 11

The nitride semiconductor according to any one of Configurations 1-10, wherein a concentration of carbon in the intermediate region is higher than a concentration of carbon in the first nitride region and higher than a concentration of carbon in the second nitride region, or the first nitride region and the second nitride region do not include carbon.

Configuration 12

The nitride semiconductor according to Configuration 11, wherein the concentration of carbon in the intermediate region is not less than $1\times10^{17}$ $cm^{-3}$ and not more than to $5\times10^{18}$ $cm^{-3}$.

Configuration 13

The nitride semiconductor according to any one of Configurations 1-12, wherein a concentration of silicon in the intermediate region is higher than a concentration of silicon in the first nitride region and higher than a concentration of silicon in the second nitride region, or the first nitride region and the second nitride region do not include silicon.

Configuration 14

The nitride semiconductor according to Configuration 13, wherein the concentration of silicon in the intermediate region is not less than $1\times10^{17}$ $cm^{-3}$ and not more than to $5\times10^{18}$ $cm^{-3}$.

Configuration 15

The nitride semiconductor according to any one of Configurations 1-14, wherein the nitride member further includes a third nitride region including $Al_{x3}Ga_{1-x3}N$ ($0<x3\leq1$, $x2<x3$), and the second nitride region is located between the first nitride region and the third nitride region.

Configuration 16

The nitride semiconductor according to Configuration 15, wherein the second nitride region includes a contact region contacting the third nitride region, a thickness of the contact region in the first direction is 1/10 of a thickness of the second nitride region in the first direction, and a concentration of the first element in the contact region is 1/20 or less of a concentration of the first element in the first nitride region.

Configuration 17

A nitride semiconductor, comprising:

a nitride member, the nitride member including:

a first nitride region including $Al_{x1}Ga_{1-x1}N$ ($0\leq x1<1$), the $Al_{x1}Ga_{1-x1}N$ including a first element including at least one selected from the group consisting of Fe and Mn;

a second nitride region including $Al_{x2}Ga_{1-x2}N$ ($0\leq x2<1$), a direction from the first nitride region to the second nitride region being along a first direction; and an intermediate region provided between the first nitride region and the second nitride region, the intermediate region including $Al_{z1}Ga_{1-z1}N$ ($0\leq z1\leq1$, $x1<z1$, $x2<z1$), a first concentration of the first element in the first nitride region being higher than a second concentration of the first element in the second nitride region, an intermediate concentration of the first element in the intermediate region decreasing along a first orientation from the first nitride region to the second nitride region, and a change rate of the intermediate concentration with respect to a change of a position along the first orientation being higher than a change rate of the first concentration with respect to the change of the position, and being higher than a change rate of the second concentration with respect to the change of the position.

Configuration 18

The nitride semiconductor according to Configuration 17, wherein the second concentration decreases along the first orientation.

Configuration 19

A semiconductor device, comprising:

the nitride semiconductor according to Configuration 15 or 16;

a first electrode;

a second electrode; and a third electrode, a direction from the first electrode to the second electrode being along a second direction crossing the first direction, a position of the third electrode in the second direction being between a position of the first electrode in the second direction and a position of the second electrode in the second direction, the second nitride region including a first partial region, a second partial region, and a third partial region, a direction from the first partial region to the first electrode being along the first direction, a direction from the second partial region to the second electrode being along the first direction, the first electrode being electrically connected to a portion of the third nitride region, and the second electrode being electrically connected to another portion of the third nitride region.

Configuration 20

The semiconductor device according to Configuration 19, wherein the third electrode is in contact with the third nitride region.

Configuration 21

The nitride semiconductor according to any one of Configurations 1-18, wherein the x1 is not less than 0 and not more than 0.1, the x2 is not less than 0 and not more than to 0.1, and the z1 is not less than 0.8 and not more than 1.

Configuration 22

The nitride semiconductor according to Configuration 15 or 16, wherein the x1 is not less than 0 and not more than 0.1, the x2 is not less than 0 and not more than 0.1, the x3 is not less than 0.15 and not more than to 0.3, and the z1 is not less than 0.8 and not more than to 1.

According to the embodiments, it is possible to provide a nitride semiconductor and a semiconductor device capable of improving characteristics.

Configuration 23

The nitride semiconductor according to Configuration 17 or 18, wherein the nitride member further includes a third nitride region including $Al_{x3}Ga_{1-x3}N$ ($0<x3\leq1$, $x2<x3$), and the second nitride region is located between the first nitride region and the third nitride region.

Configuration 24

The nitride semiconductor according to Configuration 23, wherein the second nitride region includes a contact region contacting the third nitride region, a thickness of the contact region in the first direction is 1/10 of a thickness of the second nitride region in the first direction, and a concentration of the first element in the contact region is 1/20 or less of a concentration of the first element in the first nitride region.

Configuration 25

A semiconductor device, comprising:

the nitride semiconductor according to Configuration 23 or 24;

a first electrode;

a second electrode; and a third electrode, a direction from the first electrode to the second electrode is along a second direction crossing the first direction, a position of the third electrode in the second direction being between a position of the first electrode in the second direction and a position of the second electrode in the second direction, the second nitride region including a first partial region, a second partial region, and a third partial region, a direction from the first partial region to the first electrode being along the first direction, a direction from the second partial region to the second electrode being along the first direction, the first electrode being electrically connected to a portion of the third nitride region, and the second electrode is electrically connected to another portion of the third nitride region.

Configuration 26

The semiconductor device according to Configuration 25, wherein the third electrode is in contact with the third nitride region.

In the specification of the present application, "electrically connected state" includes a state in which a plurality of conductors are physically in contact with each other and current flows between the plurality of conductors. "Electrically connected state" includes a state in which another conductor is inserted between a plurality of conductors and current flows between the plurality of conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nitride semiconductors such as nitride regions, base bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nitride semiconductors and semiconductor devices practicable by an appropriate design modification by one skilled in the art based on the nitride semiconductors and semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor, comprising:

a nitride member, the nitride member including:

a first nitride region including $Al_{x1}Ga_{1-x1}N$ ($0\leq x1<1$), the first nitride region including a first element including at least one selected from the group consisting of Fe and Mn;

a second nitride region including $Al_{x2}Ga_{1-x2}N$ ($0\leq x2<1$), a direction from the first nitride region to the second nitride region being along a first direction; and an intermediate region provided between the first nitride region and the second nitride region, the intermediate region including $Al_{z1}Ga_{1-z1}N$ ($0\leq z1\leq1$), a composition of aluminum in the intermediate region is higher than a composition of aluminum in the first nitride region and a composition of aluminum in the second nitride region, wherein the nitride member further includes oxygen, and a concentration of oxygen in the intermediate region is higher than a concentration of oxygen in the first nitride region and a concentration of oxygen in the second nitride region.

2. The nitride semiconductor according to claim 1, wherein the concentration of oxygen in the first nitride region is zero.

3. The nitride semiconductor according to claim 1, wherein the concentration of oxygen in the intermediate region is $5\times10^{16}$ $cm^{-3}$ or more, the concentration of oxygen in the first nitride region is less than $5\times10^{16}$ $cm^{-3}$, and the concentration of oxygen at a middle position of the second nitride region is less than $5\times10^{16}$ $cm^{-3}$.

4. The nitride semiconductor according to claim 1, wherein the second nitride region includes the first element, and a concentration of the first element in the first nitride region is higher than a concentration of the first element in the second nitride region, or the second nitride region does not include the first element.

5. The nitride semiconductor according to claim 4, wherein the concentration of the first element in the first nitride region is $1\times10^{17}$ $cm^{-3}$ or more.

6. The nitride semiconductor according to claim 4, wherein the intermediate region includes the first element, and a concentration of the first element in the intermediate region decreases along a first orientation from the first nitride region to the second nitride region, and a change rate of the concentration in the intermediate region with respect to a change of a position along the first orientation is higher than a change rate of the concentration in the second nitride region with respect to the change of the position.

7. The nitride semiconductor according to claim 6, wherein the change rate of the concentration in the intermediate region is higher than a change rate of the concentration in the first nitride region with respect to the change of the position.

8. The nitride semiconductor according to claim 1, wherein an intermediate region thickness of the intermediate region along the first direction is not less than 0.5 nm and not more than 4 nm.

9. The nitride semiconductor according to claim 8, wherein a second nitride region thickness of the second nitride region along the first direction is not less than 10 nm and not more than 1000 nm.

10. The nitride semiconductor according to claim 9, wherein a first nitride region thickness of the first nitride region along the first direction is not less than 10 μm and not more than 1000 μm.

11. The nitride semiconductor according to claim 1, wherein the nitride member further includes carbon, and a concentration of carbon in the intermediate region is higher than a concentration of carbon in the first nitride region and a concentration of carbon in the second nitride region, or the first nitride region and the second nitride region do not include carbon.

12. The nitride semiconductor according to claim 11, wherein the concentration of carbon in the intermediate region is not less than $1\times10^{17}$ $cm^{-3}$ and not more than to $5\times10^{18}$ $cm^{-3}$.

13. The nitride semiconductor according to claim 11, wherein the nitride member further includes silicon, and a concentration of silicon in the intermediate region is higher than a concentration of silicon in the first nitride region and a concentration of silicon in the second nitride region, or the first nitride region and the second nitride region do not include silicon.

14. The nitride semiconductor according to claim 13, wherein the concentration of silicon in the intermediate region is not less than $1\times10^{17}$ $cm^{-3}$ and not more than to $5\times10^{18}$ $cm^{-3}$.

15. The nitride semiconductor according to claim 1, wherein the nitride member further includes a third nitride region including $Al_{x3}Ga_{1-x3}N$ ($0<x3\leq1$, $x2<x3$), and the second nitride region is located between the first nitride region and the third nitride region.

16. The nitride semiconductor according to claim 15, wherein the second nitride region includes a contact region contacting the third nitride region, a thickness of the contact region in the first direction is 1/10 of a thickness of the second nitride region in the first direction, and a concentration of the first element in the contact region is 1/20 or less of a concentration of the first element in the first nitride region.

17. A nitride semiconductor, comprising:

a nitride member, the nitride member including:

a first nitride region including $Al_{x1}Ga_{1-x1}N$ ($0\leq x1<1$);

a second nitride region including $Al_{x2}Ga_{1-x2}N$ ($0\leq x2<1$), a direction from the first nitride region to the second nitride region being along a first direction; and an intermediate region provided between the first nitride region and the second nitride region, the intermediate region including $Al_{z1}Ga_{1-z1}N$ ($0\leq z1\leq1$), a composition of aluminum in the intermediate region is higher than a composition of aluminum in the first nitride region and a composition of aluminum in the second nitride region, wherein the nitride member further includes a first element including at least one selected from the group consisting of Fe and Mn, a concentration of the first element in the first nitride region is higher than a concentration of the first element in the second nitride region, a concentration of the first element in the intermediate region decreasing along a first orientation from the first nitride region to the second nitride region, and a change rate of the concentration of the first element in the intermediate region with respect to a change of a position along the first orientation is higher than a change rate of the concentration of the first element in the first nitride region with respect to the change of the position, and is higher than a change rate of the concentration of the first element in the second nitride region with respect to the change of the position.

18. The nitride semiconductor according to claim 17, wherein the concentration of the first element in the second nitride region decreases along the first orientation.

19. A semiconductor device, comprising:

the nitride semiconductor according to claim 15;

a first electrode;

a second electrode; and a third electrode, a direction from the first electrode to the second electrode being along a second direction crossing the first direction, a position of the third electrode in the second direction being between a position of the first electrode in the second direction and a position of the second electrode in the second direction, the second nitride region including a first partial region, a second partial region, and a third partial region, a direction from the first partial region to the first electrode being along the first direction, a direction from the second partial region to the second electrode being along the first direction, the first electrode being electrically connected to a portion of the third nitride region, and the second electrode being electrically connected to another portion of the third nitride region.

20. The semiconductor device according to claim 19, wherein the third electrode is in contact with the third nitride region.

* * * * *